United States Patent [19]

Schick et al.

[11] Patent Number: 4,503,521
[45] Date of Patent: Mar. 5, 1985

[54] NON-VOLATILE MEMORY AND SWITCHING DEVICE

[75] Inventors: Jerome D. Schick, LaGrangeville; Howard R. Wilson, Poughkeepsie, both of N.Y.

[73] Assignee: International Business Machines Corporation, Armonk, N.Y.

[21] Appl. No.: 392,416

[22] Filed: Jun. 25, 1982

[51] Int. Cl.³ ..................... G11C 11/40; G11C 11/36
[52] U.S. Cl. ................................. 365/182; 365/175; 357/15
[58] Field of Search ..................... 365/182, 175, 189; 357/12, 13, 15, 49, 54

[56] References Cited

U.S. PATENT DOCUMENTS 4,005,469  1/1977  Chang et al. ........................ 357/15
4,010,482  3/1977  Abbas et al. ........................ 357/15
4,104,732  8/1978  Hewlett, Jr. ........................ 365/175

Primary Examiner—Terrell W. Fears
Attorney, Agent, or Firm—Anne Vachon Dougherty; John A. Jordan

[57] ABSTRACT

A non-volatile semiconductor memory and switching device employing a Schottky barrier junction and a dual layered dielectric system for entrapping charges adjacent thereto. The dual layered dielectric system typically comprises a layer of nitride on a layer of oxide arranged such that trapped charges within the oxide and at the nitride-oxide interface act to alter the depletion region beneath, and in the vicinity of, the Schottky contact. Trapped charges may be made to selectively modify the Schottky barrier depletion region and vary its conductivity characteristics between a diode characteristic (OFF) at one extreme and ohmic contact (ON) at the other, all in accordance with the magnitude and sign of the trapped charges.

13 Claims, 5 Drawing Figures

NON-VOLATILE MEMORY AND SWITCHING DEVICE

DESCRIPTION

BACKGROUND OF THE INVENTION

1. Field of the Invention

The present invention relates to semiconductor memory and switching devices and, more particularly, to non-volatile semiconductor memory and switching devices employing a Schottky barrier junction and a dual dielectric system for entrapping charges adjacent thereto. Trapped charges cause the Schottky barrier junction to vary in conductivity characteristics between that of a conventional diode (OFF) and that of a simple ohmic contact (ON) in accordance with the magnitude of the trapped charge.

2. Description of the Prior Art

Need has existed for some time for semiconductor memory and switching devices which are simple in design and capable of manufacture in compact arrays, and which provide memory and switching capability that permits rapid, non-destructive data readout, as required for certain switching and programmed read only memory (PROM) applications.

The prior art is replete with various types of semiconductor memory and switching devices susceptible to configuration in array fashion. One such device is the insulated gate field effect transistor made alterable by using layers of different dielectric insulating material capable of storing or capturing electron charges when a voltage exceeding a certain critical value is applied to the gate. Examples of such prior art may be found by reference to U.S. Pat. No. 3,882,469 to W. M. Gosney, Jr. entitled "Non-volatile Variable Threshold Memory Cell" and to U.S. Pat. No. 3,649,884 to Y. Haneta entitled "Field Effect Semiconductor Device with Memory Function". An example of a non-volatile diode cross point memory array using dual layered dielectric and a diffused semiconductor structure may be found by reference to U.S. Pat. No. 3,838,405 to Arnett et al. A non-volatile memory cell using the dual layered dielectric with Schottky barrier diode has also been employed in the prior art. An example of the latter arrangement may be found in U.S. Pat. No. 4,010,482 to Abbas et al.

The difficulty with the above and other non-volatile memory cell arrangements, resides in the fact that they are difficult to make and fail to lend themselves to fabrication at sufficiently high densities. Accordingly, need still exists for improved semiconductor memory and switching devices exhibiting the characteristics of being non-volatile and permitting non-destructive readout, and yet are simple to make and easy to integrate into dense arrays.

SUMMARY OF THE INVENTION

Accordingly, it is an object of the present invention to provide an improved semiconductor memory and switching device.

It is a further object of the present invention to provide an improved semiconductor memory and switching device which is capable of rapid, non-destructive readout and which is readily integratable into dense arrays.

It is yet a further object of the present invention to provide a non-volatile memory and switching device which exhibits high speed readout and which is simple to make in dense arrays.

It is another object of the present invention to provide a non-volatile memory and switching device which is capable of rapid, nondestructive readout and which may be employed as a memory, switch, selectively variable impedance or unilateral conducting device.

These and other objects and advantages of the invention are achieved by employing a Schottky barrier junction at a semiconductor substrate with a dual layered insulation or dielectric scheme for entrapping charges arranged adjacent thereto such that the trapped charges cause the Schottky barrier junction to vary in conductivity characteristics between a diode characteristic (OFF) at one extreme and ohmic contact (ON) at the other, all in accordance with the particular magnitude and polarity of trapped charges. The dual layered dielectric system typically comprises a layer of nitride on a layer of oxide with the nitride-oxide interface positioned adjacent the Schottky barrier contact such that charges trapped within the oxide and at the interface act to alter the depletion region beneath, and in the vicinity of, the contact. A selector gate electrode is positioned over the nitride-oxide dual layer adjacent the Schottky barrier contact to permit application of appropriate voltage potential to cause current to flow across the nitride-oxide layers with the conduction process thereacross being a function of the differing dielectric constants of the nitride and oxide materials. Ohmic contact to the semiconductor substrate material provides the device cathode while the Schottky barrier contact acts to provide the device anode.

The foregoing and other objects, features and advantages of the invention will be apparent from the following more particular description of the preferred embodiments of the invention, as illustrated in the accompanying drawings.

DETAILED DESCRIPTION OF THE DRAWINGS

Figure 1:
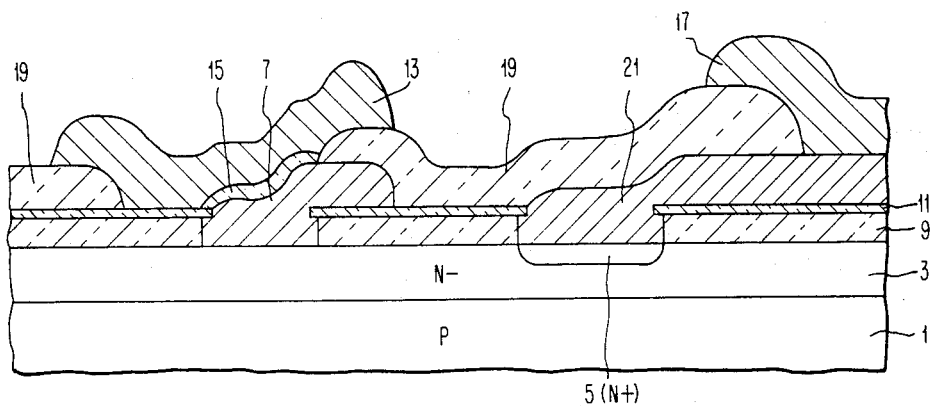
FIG. 1 shows in vertical cross-section one arrangement of the Schottky barrier diode with dual layered dielectric system, in accordance with the present invention.

With reference now to FIG. 1, there is shown a preferred arrangement of the Schottky barrier diode with dual dielectric system, in accordance with the principles of the present invention. In the arrangement illustrated in FIG. 1, the non-volatile memory and switching cell is generally fabricated on a P$^-$ type silicon substrate 1. An N$^-$-type epitaxial layer 3 having a typical thickness of about 0.1 to 3 microns and a specific resistivity of about 0.1 to 10 ohms-centimeter is provided on the surface of the substrate, in conventional manner. An N$^+$-type diffusion region 5 is provided in the epitaxial layer for purposes of making good cathode contact to metal 21. Anode means is provided via metal electrode 7 connected in Schottky contact to the upper surface of epitaxial layer 3. In this regard, metal 7 may comprise aluminum deposited after a thin layer of platinum silicide, for example, is formed on the epitaxial silicon. In addition to platinum silicide, other anode or barrier metals may be employed to form the Schottky contact, such as Ta, TiW, and the like. A dual layered dielectric system is formed by layers 9 and 11. These layers are shown circumscribing the anode and cathode contacts and, in the preferred mode, comprise layers of silicon dioxide and silicon nitride, the former shown at 9 as deposited upon the epitaxial layer while the silicon nitride, as shown at 11, is, in turn, deposited upon the silicon dioxide.

A metal selector gate structure is shown at 13 formed adjacent to and over anode 7. In this regard, it can be seen that the gate structure is isolated from the anode structure by insulator layer 15 such as to avoid the shorting of these structures. As can be seen, gate structure 13 makes direct contact with silicon nitride layer 11 adjacent the Schottky barrier contact in a manner such as to permit the trapping of charges within the dual layered dielectric system in close proximity to the Schottky anode. This is done so that the trapped charges may act to influence the depletion region formed by the Schottky contact, as will be described in more detail hereinafter with regard to FIGS. 2-4. It should be appreciated, that successful operation of the device, in accordance with the principles of the present invention, does not necessitate gate structure 13 overlapping Schottky contact 7, as shown in FIG. 1. Gate 13 is shown overlapping Schottky contact 7 in FIG. 1 for purposes of convenience and as representing a practical way of implementing the structure. Obviously, other arrangements are possible.

The gate structure 13, as shown in FIG. 1, may either fully circumscribe Schottky contact 7 or partially circumscribe Schottky contact 7, as shown. Since the charge pattern formed in the dual layered dielectric system, as effected by voltage applied to gate structure 13, determines the cross sectional area within which current may flow between anode and cathode, it is clear that current density between anode and cathode is a function of the extent to which gate 13 circumscribes the Schottky contact. Accordingly, it is evident that where high current density is desired, the gate structure should be restricted as to the extent it circumscribes the Schottky contact. On the other hand, a restricted gate structure requires greater charge to form a conductive path. As is evident to those skilled in the art, the extent to which the gate is made to circumscribe Schottky contact 7 may, therefore, be selected as a design parameter in accordance with the particular application of the device.

As shown in FIG. 1, the second level metallurgy forming gate structure 13 and cathode via 17 are isolated by insulating layer 19. In the preferred mode, the second layer of metallurgy is formed of aluminum with cathode contact 21 also formed of aluminum.

The non-volatile memory and switching device, in accordance with the principles of the present invention, may be fabricated by employing conventional fabrication techniques, as is understood by those skilled in the art. As an example of the manner in which the device may be fabricated, the following series of steps may be employed in routine manner. Starting with N$^-$-type layer 3 on P$^-$-type substrate 1, N$^+$ type region 5 is formed by a conventional diffusion process into epi layer 3. After fabrication of N$^+$ region 5, silicon dioxide layer 9 and silicon nitride layer 11 are formed by conventional deposition techniques. For example, these layers may be formed in succession by chemical vapor deposition techniques. After formation of layers 9 and 11, conventional photolithography is employed to make openings in the insulating layers for the formation of Schottky barrier contact 7 and cathode contact 21. These contacts may be formed by blanket depositing a layer of aluminum, for example, and etching away undesired regions of aluminum. A layer 19 of silicon dioxide, for example, may then be deposited by any of the variety of techniques, such as sputtering. The first via etch is then employed to remove regions of the silicon dioxide layer where gate electrode 13 and ohmic contact to metallurgy 7 and 21 are to be made. In this regard, it should be understood that in the cross section in FIG. 1, ohmic contact to Schottky barrier diode 7 is not shown at the particular point of cross section.

After selected regions of silicon dioxide layer 19 are etched away, insulating layer 15 is formed to separate gate electrode 13 from Schottky barrier contact 7. This layer may be formed by the evaporation of an oxide, such as silicon dioxide or, alternatively, by oxidation of the aluminum Schottky contact. Where latter technique is employed, it is evident that other vias to the aluminum cannot be made until after oxidation. After insulating layer 15 is formed, the second layer of metallurgy is deposited by, for example, chemical vapor deposition. In the preferred embodiment, this metallurgy is, again, aluminum, although other metals may as readily be employed. Conventional photolithographic techniques are employed to remove the unwanted aluminum, leaving electrodes 13 and 17, as shown in FIG. 1.

Figure 2:
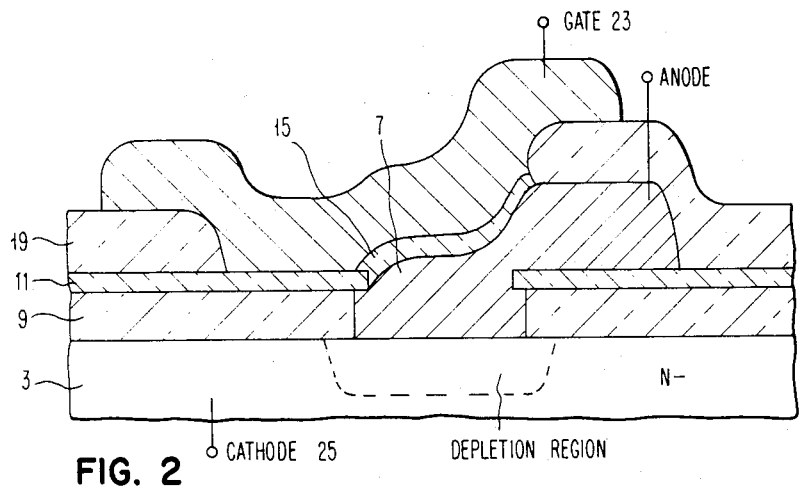
FIG. 2 shows in vertical cross-section the Schottky barrier diode with dual dielectric system in accordance with the present invention wherein the depicted Schottky contact depletion region reflects a condition wherein nominally no charge is trapped in the dual layered dielectric system.

With reference to FIG. 2, there is shown the non-volatile memory and switching device of the present invention, as shown in FIG. 1, simplified for purposes of explanation by eliminating substrate layer 1, N$^+$ region 5 and cathode contact 21. The cathode connection is schematically shown in FIG. 2 as being made directly to epitaxial layers. FIG. 2 depicts the configuration of the depletion region formed by Schottky barrier contact 7 when, at least nominally, no charge is entrapped in dual layered dielectric 9-11. The I-V characteristic A shown in FIG. 5 corresponds to the condition wherein there is nominally no entrapped charge. (Q designated as being equal to 0.) Under such a condition, the depletion region inhibits low voltage conduction between anode and cathode. It is not until higher voltage are reached, e.g. ½ volt in the forward direction and greater than breakdown in the reverse direction, that any significant conduction begins.

Figure 3:
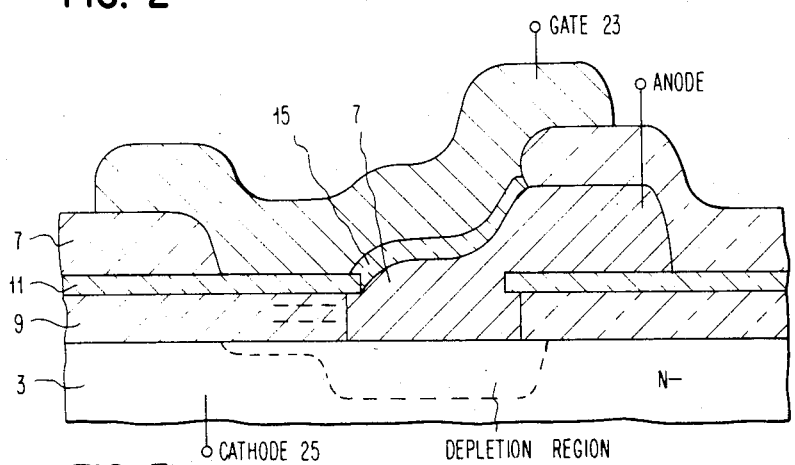
FIG. 3 shows in vertical cross-section the Schottky barrier diode with dual dielectric system in accordance with the present invention wherein the depicted Schottky contact depletion region reflects a condition of modification by negative charges trapped in the dual layered dielectric system.
Figure 5:
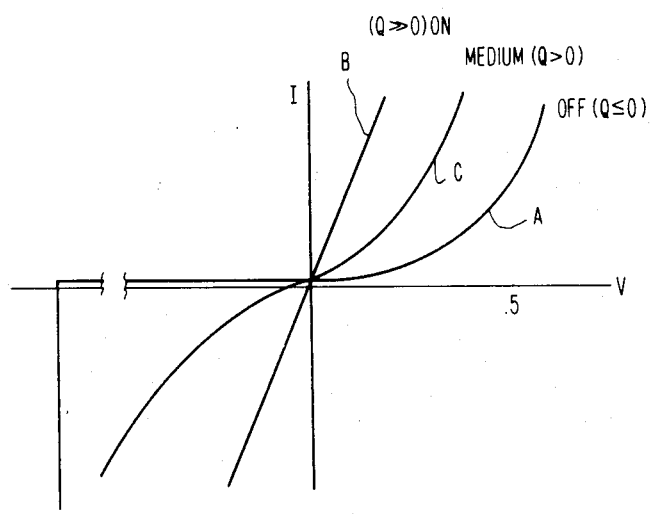
FIG. 5 shows the various I-V characteristics of the non-volatile memory and switching device, in accordance with the present invention, as a function of the magnitude and type of trapped charge.

The I-V characteristic shown at A in FIG. 5 also represents the device condition when a negative charge is entrapped in the dual layered dielectric system 9–11, as shown in FIG. 3. In this regard, electrons may be trapped in layers 9–11 by applying a negative voltage to gate electrode 23 with respect to cathode 25. Electron storage is obtained through the standard conduction process of the oxide-nitride structure wherein the two films of different dielectric constants effect charge trapping and storage. Thus, conduction is induced from gate electrode 23 to cathode 25 via insulating layers 9 and 11 at the periphery of the Schottky barrier diode region 7 to thereby effect charge trapping and storage. As shown in FIG. 3, the entrapping of electrons in oxide layer 9 acts to modify the depletion region caused by the Schottky barrier contact such that the depletion region is extended beneath the silicon dioxide layer 9. Again, as was stated with regard to FIG. 2, the depletion region acts to inhibit low voltage conduction between anode and cathode.

Figure 4:
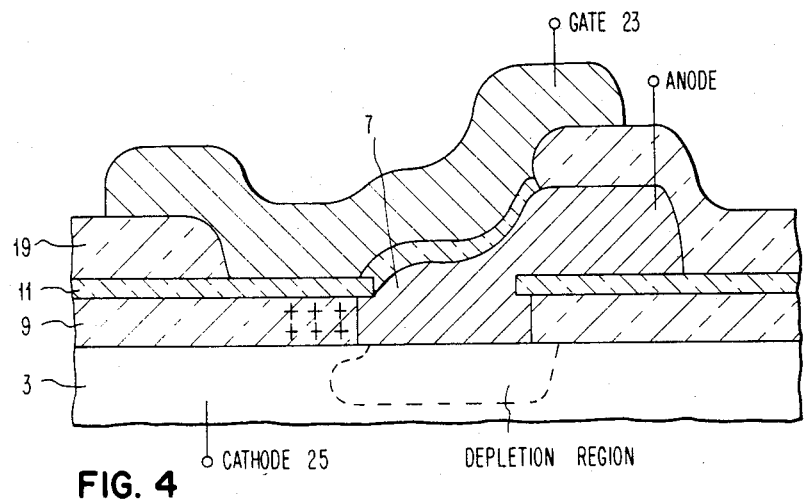
FIG. 4 shows in vertical cross-section the Schottky barrier diode with dual dielectric system in accordance with the present invention wherein the depicted Schottky contact depletion region reflects a condition of modification by positive charges trapped in the dual layered dielectric system.

Low voltage conduction between anode and cathode is achieved, in accordance with the present invention, by trapping a positive charge in the dual layered dielectric system. Positive charges may be trapped by applying a positive potential to gate 23 with respect to cathode 25 whereby the conduction process through the oxide-nitride structure acts to create the charge. As shown in FIG. 4, the trapped positive charges act to modify the depletion region by causing an accumulation of electrons within and at the surface of the $N^-$-type epi layer beneath the positive charges. This in effect causes the region of accumulation to be more N-type and acts to create a limited conduction path between Schottky contact 7 and cathode 25. Where the trapped charges are of moderate magnitude, the current voltage characteristic appears like that shown at C in FIG. 5. On the other hand, where the magnitude of the trapped positive charges is large, the depletion region is diminished further at the interface via a larger region of accumulated electrons. Under this latter condition, a larger area of N-type material at the interface is available for conduction whereby low voltage conduction is obtained. This is represented by the current voltage characteristic B in FIG. 5.

It should be appreciated that the electron accumulation, and therefore cross section of epitaxial material permitting conduction between anode and cathode, varys as a function of the magnitude of the trapped positive charges. Accordingly, the trapped positive charges act to modulate the cross-sectional area permitting conduction. In this regard, I-V characteristics A and B shown in FIG. 5 represent the extremes of current-voltage characteristics and it should be understood that there are a whole range of characteristics between A and B which exist as a function of the magnitude of the trapped positive charges. It should be appreciated that characteristic A in FIG. 5 represents the normal diode characteristic achieved by a 0 charge or negative charge condition in the device. Breakdown is achieved in the reverse-biased condition at the normal high voltage breakdown point. On the other hand, characteristic B in FIG. 5 is analogous to a low resistance ohmic contact and would be indicative of the ON condition in a switching device.

It should be further appreciated, that the non-volatile memory and switching device in accordance with the present invention may be employed in any of a variety of applications. As hereinabove stated, gate 23 may be varied in controllable fashion to modulate the conductivity path between anode and cathode. The device, in this regard, may be employed as an emplifier with fixed gain (voltage gain). The device may also be employed as an on/off switch for logic applications or as a memory device. As is understood by those skilled in the art, the device may also be employed as a clipping device, clamp or limiting device.

While the invention has been particularly shown and described with reference to the preferred embodiments thereof, it will be understood by those skilled in the art that various changes in form and details may be made therein without departing from the spirit and scope of the invention.

What is claimed is:

1. A non-volatile switch and memory device, comprising;
    a semiconductor substrate;
    first electrode means in ohmic contact with said semiconductor substrate;
    second electrode means in Schottky contact with said semiconductor substrate forming a depletion region therein which acts as a conduction barrier to said first electrode means;
    insulating means surrounding at least a portion of said Schottky contact and arranged to include a dual dielectric structure for entrapping positive charges therein in response to voltage means causing positive potential to be supplied therethrough to said substrate; and
    voltage means including conductive control means deposited upon said insulating means surrounding at least a portion of said Schottky contact, said voltage means including gate electrode means for causing a positive potential to be supplied to said substrate and positive charges to be entrapped in said insulating means whereby said charges act to modify said depletion region to allow conduction between said first and second electrodes.

2. The non-volatile switch and memory device as set forth in claim 1 wherein said first electrode means acts as a cathode and second electrode means acts as an anode.

3. The non-volatile switch and memory device as set forth in claim 2 wherein said insulating means includes a first layer of silicon dioxide and a second layer of silicon nitride.

4. The non-volatile switch and memory device of claim 3 wherein said first electrode means makes ohmic contact to said substrate through an $N^+$-type diffusion.

5. The non-volatile switch and memory device of claim 4 wherein said conductive control means is formed of aluminum.

6. A non-volatile switch and memory device comprising:
    a semiconductor substrate of one conductivity type having a first electrode in ohmic contact therewith,
    a second electrode in contact with said substrate through a Schottky barrier,
    a thin layer of insulating material adjacent said Schottky barrier with said thin layer of insulating material including charge trapping centers for entrapping positive charges therein when a positive potential is supplied to said substrate through said thin layer of insulating material upon application of a voltage thereacross adjacent said Schottky barrier, and a layer of conductive material deposited upon said thin layer of insulating material adjacent said Schottky barrier with a third electrode means in ohmic contact therewith for applying said voltage across the said thin layer of insulating material such that said current is supplied to said substrate causing charges to be trapped in said thin layer of insulating material adjacent said Schottky barrier whereby conduction between said first and second electrodes is controlled through said charges modifying the Schottky barrier depletion region in said semiconductor substrate to form an accumulation region which acts to permit conduction between said first and second electrodes.

7. The non-volatile switch and memory device as set forth in claim 6 wherein said thin layer of insulating material comprises a layer of silicon nitride on a layer of silicon dioxide.

8. The non-volatile switch and memory device as set forth in claim 6 wherein said first electrode makes ohmic contact to said semiconductor substrate through an N+-type diffusion region.

9. The non-volatile switch and memory device as set forth in claim 8 wherein said layer of conductive material is aluminum.

10. A non-volatile switch and memory device, comprising;
a semiconductor substrate;
first electrode means in ohmic contact with said substrate;
second electrode means in Schottky contact with said substrate;
a layer of insulating material means adjacent to and surrounding at least a portion of said Schottky contact with said layer of insulating material means including charge trapping centers for entrapping positive charges therein when a positive potential is supplied to said substrate through said layer of insulating material means upon application of a voltage thereacross; and conductor means formed on said layer of insulating material means adjacent to and surrounding at least a portion of said Schottky contact for applying a voltage across said layer of insulating material means and causing said potential to be supplied to said substrate whereby the resultant charges entrapped in said layer of insulating material means adjacent said Schottky contact act to cause an accumulation of electrons in said substrate which diminish the depletion region formed by said Schottky contact and vary the conductivity path between said first and second electrode means.

11. The non-volatile switch and memory device as set forth in claim 10 wherein said layer of insulating material means includes a layer of silicon nitride on a layer of silicon dioxide.

12. The non-volatile switch and memory device as set forth in claim 11 wherein said first electrode means makes ohmic contact to said semiconductor substrate through an N+-type diffusion region.

13. The non-volatile switch and memory device as set forth in claim 12 wherein said conductor means is formed of aluminum.

* * * * *